United States Patent [19]

Ratnam

[11] Patent Number: 5,338,695
[45] Date of Patent: Aug. 16, 1994

[54] MAKING WALLED EMITTER BIPOLAR TRANSISTOR WITH REDUCED BASE NARROWING

[75] Inventor: Perumal Ratnam, Fremont, Calif.

[73] Assignee: National Semiconductor Corporation, Santa Clara, Calif.

[21] Appl. No.: 981,188

[22] Filed: Nov. 24, 1992

[51] Int. Cl.⁵ .......................................... H01L 21/265
[52] U.S. Cl. ........................................ 437/31; 437/32
[58] Field of Search ..................... 437/31, 32, 33, 162

[56] References Cited

U.S. PATENT DOCUMENTS

| | | | |
|---|---|---|---|
| 4,199,380 | 4/1980 | Farrell et al. | 437/33 |
| 4,333,774 | 6/1982 | Kamioka | 437/33 |
| 4,441,932 | 4/1984 | Akasaka et al. | 437/31 |
| 4,465,528 | 8/1984 | Goto | 437/162 |
| 4,624,046 | 11/1986 | Shideler et al. | 437/31 |

Primary Examiner—Tom Thomas
Assistant Examiner—Tuan Nguyen
Attorney, Agent, or Firm—Limbach & Limbach

[57] ABSTRACT

An improved, walled-emitter, bipolar transistor and a method for fabricating such a transistor is disclosed. The method includes the step of separately doping the edges of the active base that are adjacent to the isolation oxide in order to increase the doping level at the edges and thus counteract base narrowing that would otherwise be present.

12 Claims, 3 Drawing Sheets

MAKING WALLED EMITTER BIPOLAR TRANSISTOR WITH REDUCED BASE NARROWING

BACKGROUND OF THE INVENTION

1. Field of the Invention

This invention relates generally to bipolar transistors, and relates more particularly to a walled-emitter, polysilicon-contact, bipolar transistor having improved base characteristics, and a method for fabricating such a transistor.

2. Description of the Relevant Art

A walled-emitter, bipolar transistor has an emitter and active base that extend to an isolation oxide at one or more places. FIG. 1 depicts a plan view of a vertical, walled-emitter, bipolar transistor 10. The dashed lines 12 define boundaries between the doped regions of the transistor 10 and a surrounding isolation oxide 14. A collector contact 16, a base contact 18, and an emitter contact 20 form electrical connections with the collector, base, and emitter, respectively, of the transistor. The emitter of transistor 10 is in the doped region below the emitter contact 20. The emitter extends to the isolation oxide 14 at two locations 22 and 24. The active base 25 of transistor 10 is below the emitter region and also extends to the isolation oxide 14 at locations 22 and 24. One advantage of walled-emitter transistor design is that it makes effective use of the active base area while minimizing the parasitic collector-base capacitance for a given emitter area.

Connections or contacts to the doped regions of a bipolar transistor can be made with polysilicon, which effectively adds one level of interconnection among devices. Polysilicon contacts for bipolar transistors are common for integrated circuits having both bipolar and MOS (or CMOS) devices on the same chip.

A process for fabricating polysilicon-contact, bipolar NPN transistors typically includes the following steps. After n+ buried layers and an epitaxial layer are formed on the substrate, isolation oxide is formed to isolate regions of the substrate into n-type wells for separate transistors. Then, a layer of polysilicon is deposited on top of the substrate. The polysilicon is implanted with a p-type dopant, like boron, and diffused into the substrate to form the base of a bipolar transistor. Then, portions of the substrate are masked and the polysilicon is implanted with an n-type dopant, like arsenic, to form the emitter and emitter contacts of the bipolar transistor. The substrate is masked again and the polysilicon is implanted with a p-type dopant to form the base contacts of the transistor. During this last step, the emitter region is masked so that the p-type dopants do not enter the emitter region. After implantation, the substrate is annealed to diffuse the dopants into the silicon substrate. The three implantation steps described above may be referred to as a base implant, an n+ polysilicon implant, and a p+ polysilicon implant, respectively. The order of the n+ and p+ polysilicon implant steps is interchangeable.

One constraint to fabricating high performance, polysilicon-contact transistors with walled-emitters is the effect that device isolation can have on key parameters like leakage current (Iceo) and breakdown voltage (BVceo). As shown in FIG. 2, the problem is that a typical walled-emitter transistor has an active base region 26 that is thinner at the isolation edges 22 and 24. Note that the emitter region 28 extends to the isolation oxide 14, making it a "walled-emitter" at locations 22 and 24. Also shown in FIG. 2 are a buried layer 30 and a substrate 32. The buried layer 30 is part of the collector region of the transistor 10.

The active base 26 is thinner at the isolation edges 22 and 24 because the base implantation is less effective at those locations. When the base is formed during the base implant, an angled edge or "bird's beak" of the isolation oxide overlaps and shields the edge of the base. During the base implant, the bird's beak absorbs some of the implanted atoms, so that fewer dopant atoms are implanted at the edge of the base. Also, some of the base dopant atoms that are implanted at the edges of the base will diffuse laterally from the base into the oxide during subsequent annealing steps. The combined result of shielding by the oxide bird's beak and lateral diffusion into the oxide is that the active base 26 is thinner at the isolation edges 22 and 24 that it is away from the edges.

The thinner base 26 at the isolation edges 22 and 24 provides a site for current leakage between the emitter 28 and collector 30 and also decreases breakdown voltage. Breakdown voltage can be so low that the transistor cannot operate at maximum supply voltages. Vertical scaling of such a transistor is severely constrained, compromising device parameters such as beta and unity gain cutoff frequency, which are determined by base thickness.

One approach to overcoming the above-described problem is to laterally extend the oxide well region and open up a gap between the oxide and the edge of the emitter region. Such a transistor is not a "walled-emitter" transistor because the emitter does not extend to the oxide wall. The transistor would have an active base under the emitter of relatively uniform thickness, unaffected by the edge of the isolation oxide. A disadvantage of this approach is that more surface area is needed to fabricate a transistor having comparable performance to that of a wall-emitter transistor.

SUMMARY OF THE INVENTION

In accordance with the illustrated preferred embodiment, the present invention provides an improved-performance, walled-emitter, bipolar transistor and a method for fabricating such a transistor. The method includes the steps of isolating a region of a first polarity (n) in a semiconductor substrate, doping the substrate with a dopant of a second polarity (p) to form a base that extends to the isolation oxide, doping the substrate with a dopant of the first polarity (n) to form an emitter that extends to the isolation oxide, and further doping the substrate where the emitter extends to the isolation oxide with a dopant of the second polarity (p) to increase the level of dopant of the second polarity (p) in the active base adjacent to the isolation oxide. The last doping step increases the doping of the base adjacent to the isolation oxide to counteract the base narrowing that would otherwise be present. The polarity designations in parentheses are for an NPN transistor made according to the present invention. A PNP transistor made according to the present invention would have the polarities reversed from those of the NPN described above.

The present invention is particularly useful for fabricating bipolar transistors with polysilicon contacts. There, the method includes the steps of forming an isolation oxide in a semiconductor substrate to isolate a region of a first polarity (n), depositing a polysilicon layer on the substrate, doping a portion of the substrate with a dopant of a second polarity (p) to form a base region, ion-implanting a portion of the polysilicon with a dopant of the first polarity (n) that when diffused into the substrate will form an emitter region extending to the isolation oxide, ion-implanting a portion of the polysilicon with a dopant of the second polarity (p) where the emitter region extends to the isolation oxide, and annealing the substrate to diffuse the ion-implanted dopant of the second polarity (p) into the edges of the base region adjacent to the isolation oxide. Again, the polarity designations in parentheses are for an NPN transistor made according to the present invention; the polarities would be reversed for a PNP transistor.

The present invention can be implemented in polysilicon technology without any additional masking or implantation steps. Using an NPN transistor as an example, in conventional processing the polysilicon is masked and implanted twice after the base implant, once with an n+ polysilicon implant that forms the emitter, and once with a p+ polysilicon implant that forms a base contact. With the present invention, the p+ polysilicon implant is also used to increase the doping of the edge of the base at the isolation oxide. To do so, a standard p+ polysilicon implant mask is modified slightly to expose the edges of the emitter regions at the isolation oxide. Then, the p+ implantation proceeds, adding extra p+ dopant to the edges of the base while also forming the base contact.

The present invention decreases leakage current and improves breakdown voltage by increasing the number of charge carriers in the active base layer at the edge of the isolation oxide. In effect, the thickness of the active base layer at the edge of the isolation oxide is increased by the second p+ implantation (for an NPN transistor) in that area. The present invention is applicable to a wide range of processes and architectures that have been developed for fabricating walled-emitter bipolar transistors.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

DETAILED DESCRIPTION OF THE PREFERRED EMBODIMENT

The drawings and specification depict various preferred embodiments of the present invention for purposes of illustration only. One skilled in the art will readily recognize from the following discussion that alternative embodiments of the structures and methods illustrated herein may be employed without departing from the principles of the invention described herein.

Figure 1:
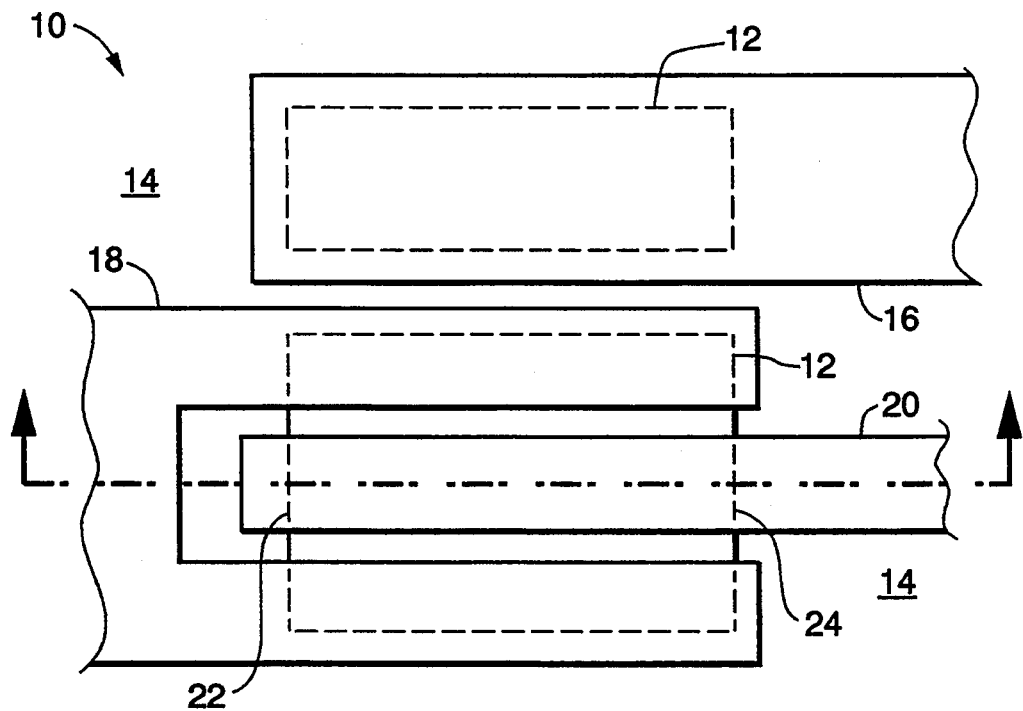
FIG. 1 is a plan view of a prior art walled-emitter, polysilicon-contact, bipolar transistor.
Figure 2:
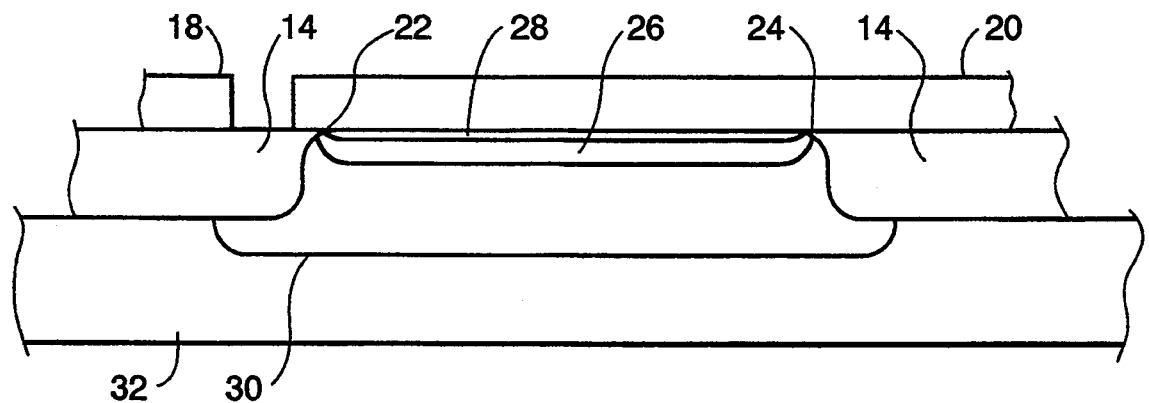
FIG. 2 is a sectional view of a prior art walled-emitter, polysilicon-contact, bipolar transistor, with the section taken as indicated by the section line of FIG. 1.
Figure 3:
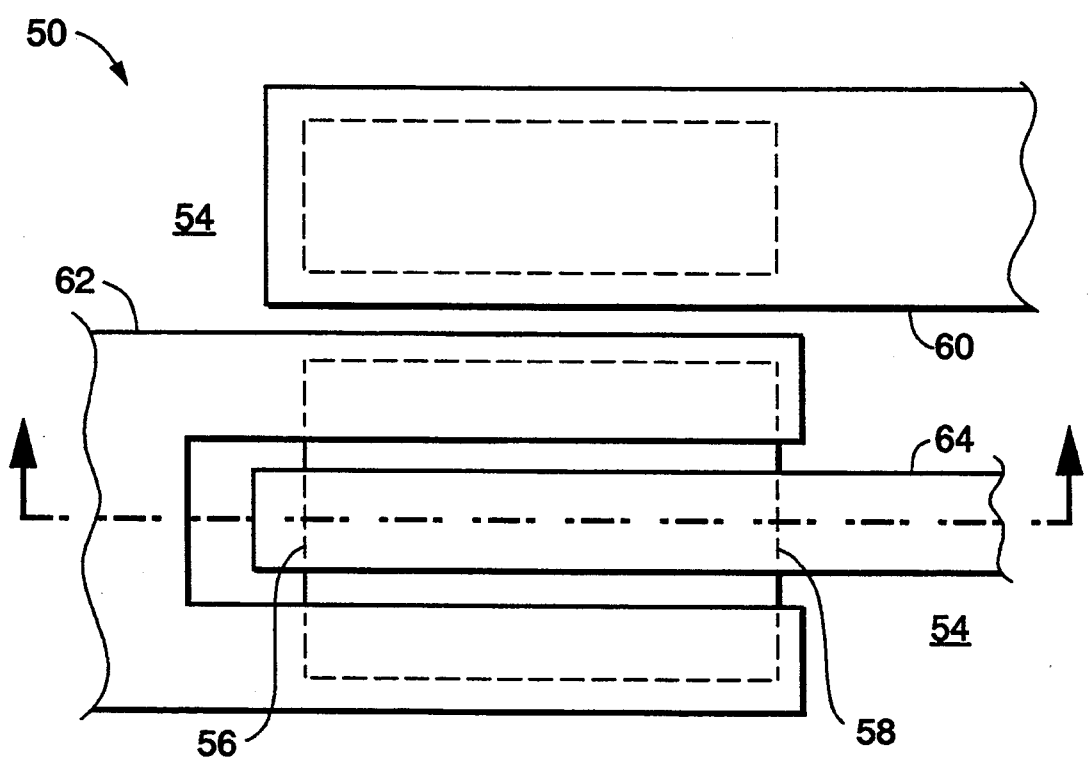
FIG. 3 is a plan view of a walled-emitter, polysilicon-contact, bipolar transistor according to the present invention.
Figure 6:
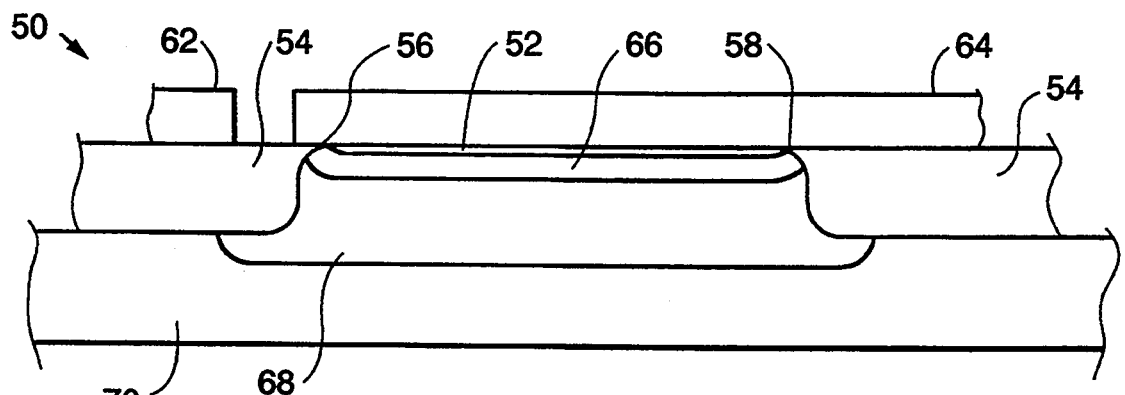
FIG. 6 is a sectional view of a walled-emitter, polysilicon-contact, NPN bipolar transistor according to the present invention, with the section taken as indicated by the section line of FIG. 3.

The preferred embodiment of the present invention is an improved-performance, walled-emitter, bipolar transistor and a method for fabricating such a transistor. As shown in FIGS. 3 and 6, a walled-emitter, NPN bipolar transistor 50 according to the present invention has an n-polarity emitter region 52 (FIG. 6) that extends to the edge of an isolation oxide region 54 at two places 56 and 58. A collector contact 60, a base contact 62, and an emitter contact 64 form electrical connections with the collector, base, and emitter, respectively, of the transistor 50. The active base 66 (FIG. 6) of transistor 50 is located under the emitter region 52 and extends to the edge of the isolation oxide at 56 and 58. Also shown in FIG. 6 are a p-type substrate 70 and an n− polarity collector region 68 that includes an n+ buried layer.

Figure 4:
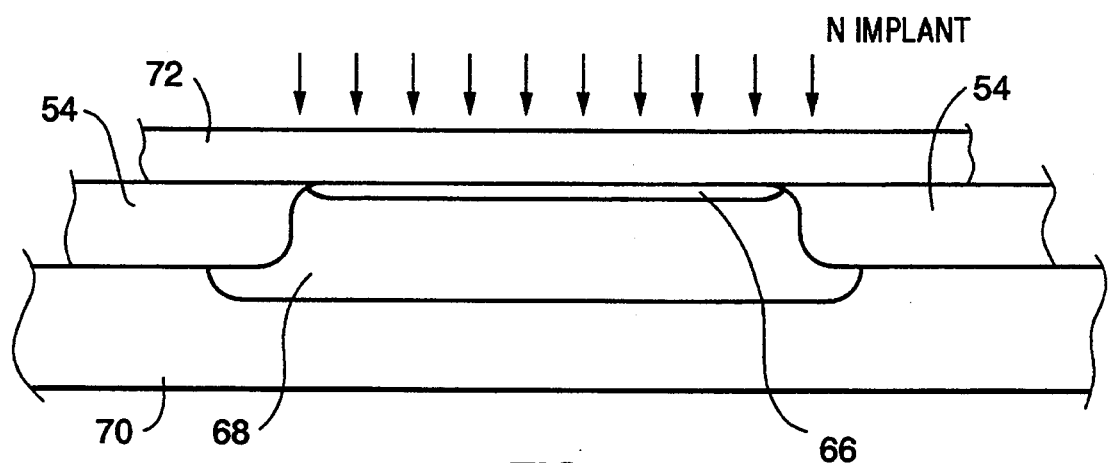
FIG. 4 is a sectional view during an n+ implantation step in the fabrication of a walled-emitter, polysilicon-contact, NPN bipolar transistor according to the present invention, with the section taken as indicated by the section line of FIG. 3.
Figure 5:
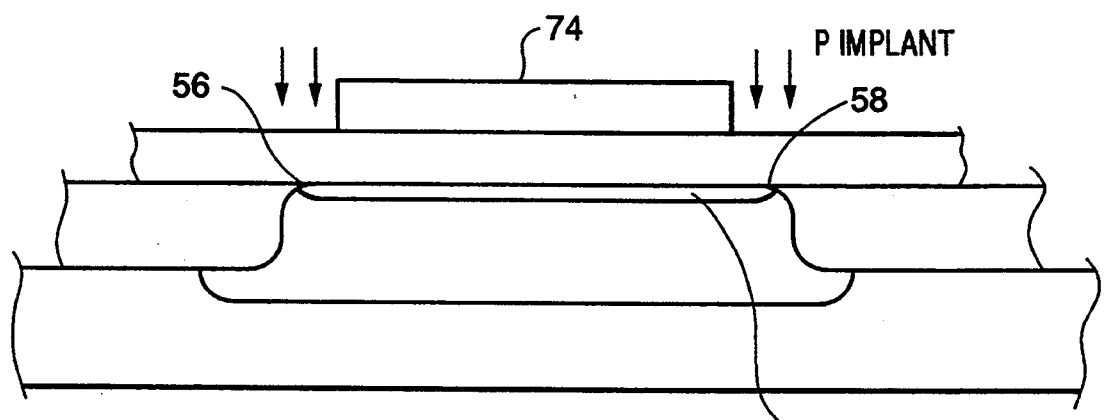
FIG. 5 is a sectional view during a p+ implantation step in the fabrication of a walled-emitter, polysilicon-contact, NPN bipolar transistor according to the present invention, with the section taken as indicated by the section line of FIG. 3.

The method of the present invention increases the thickness of the active base region 66 where the base and emitter meet the edge of the isolation oxide 54 at 56 and 58. As shown in FIGS. 4 and 5, the method of the present invention incorporates a modification of the n+ and p+ polysilicon implant steps of a conventional process.

Prior to the n+ polysilicon implant step shown in FIG. 4, the collector region 68 and isolation oxide region 54 have been formed. Also prior to the step shown in FIG. 4, a polysilicon layer 72 has been deposited on top of the substrate and the base region 66 has been formed, preferably by ion implantation. In the conventional n+ polysilicon implantation step shown in FIG. 4, the polysilicon layer 72 is implanted with an n-type dopant, like arsenic. The n-type dopant will later be diffused into the top of the substrate to form the emitter and emitter contacts of transistor 50. In the n+ polysilicon implant step, areas of the substrate over the base contact regions are masked.

A p+ polysilicon implant step, modified according to the present invention, is shown in FIG. 5. The p+ polysilicon implant step can either precede or follow the n+ polysilicon implant step shown in FIG. 4. According to prior fabrication processes, the p+ polysilicon implant step implants the polysilicon only in the base contact region and masks off the polysilicon above the emitter so that the p-type dopant is not implanted into the emitter or active base regions. According to the present invention, however, the area implanted in the p+ implantation is expanded to include the edges of the emitter region. This increases the active base thickness at the edges by increasing the number of p-type dopant atoms implanted into that area.

As shown in FIG. 5, a p+ implantation mask 74 is cut back from and exposes the edges 56 and 58 of the base region 66 to the p+ implant. Preferably, boron is used as the implanted dopant. The p+ implantation step of the present invention also performs the conventional step of implanting the polysilicon in the base contact region at the same time. The central area of what will become the emitter region 52 is masked by the p+ implantation mask 74. The implantation energy of the p+ implantation step is increased somewhat from that of the prior fabrication process, increased, for example, from 40 KV for a prior process to 60 KV for the present invention. Preferably, the implantation energy is within the range of 20 KV to 100 KV. The increased energy gives better penetration into the substrate at the edges of the active base region 66.

The edge of the p+ implantation mask 74 preferably exposes about 0.2 micrometers of the active base region 66 to the p-type implant. The position edge of the mask 74 relative to the oxide edges 56 and 58 can be adjusted to change the area of the active base region 66 exposed to the p-type implant, thus controlling the quantity of p-type atoms implanted into the edges of the active base region. Reducing the exposure will reduce the number of dopant atoms in the edges of the active base region. Depending on the quantity of extra p-type dopants needed at the edges of the active base, the desired effect might be achieved with even a slight overlap between the mask edge and the oxide edge, relying on diffusion of the dopant into the active base.

From the above description, it will be apparent that the invention disclosed herein provides a novel and advantageous method for fabricating an improved-performance, walled-emitter, bipolar transistor, as well as the transistor itself. The foregoing discussion discloses and describes merely exemplary methods and embodiments of the present invention. As will be understood by those familiar with the art, the invention may be embodied in other specific forms without departing from the spirit or essential characteristics thereof. For example, a single-layer polysilicon process is described herein, but the invention can also be used with other processes, including a double-layer polysilicon process. Accordingly, the disclosure of the present invention is intended to be illustrative, but not limiting, of the scope of the invention, which is set forth in the following claims.

What is claimed is:

1. A method for fabricating a walled-emitter bipolar transistor having an emitter and a collector of a first polarity and a base of a second polarity, wherein the method comprises the steps of:

providing a semiconductor substrate having a region of the first polarity isolated by isolation oxide; and then uniformly doping a portion of the substrate with a dopant of the second polarity to form a base that extends to the isolation oxide; and thereafter doping the substrate with a dopant of the first polarity to form an emitter that extends to the isolation oxide along an emitter-isolation oxide junction; and further doping the semiconductor substrate along the emitter-isolation oxide junction with a dopant of the second polarity to increase the level of dopant of the second polarity in the base adjacent to the isolation oxide, wherein said further doping occurs in the vicinity of the emitter-isolation oxide junction and not over the entire emitter area.

2. A method as recited in claim 1 wherein the transistor is an NPN transistor, and wherein the polarity of the emitter and collector is negative and the polarity of the base is positive.

3. A method as recited in claim 2 wherein the step of further doping and semiconductor substrate where the emitter extends to the isolation oxide is performed by ion implanting a dopant at an energy with the range of 30 to 60 KV.

4. A method as recited in claim 1 wherein the transistor is a PNP transistor, wherein the polarity of the emitter and collector is positive and the polarity of the base is negative.

5. A method as recited in claim 1 wherein each doping step includes the steps of ion implanting followed by annealing.

6. A method for fabricating a walled-emitter bipolar transistor having an emitter region that extends to an edge of an isolation oxide region, wherein the method comprises the steps of:

forming an isolation oxide in a semiconductor substrate to isolate a region of a first polarity;

depositing a polysilicon layer on the substrate;

uniformly doping a portion of the substrate with a dopant of a second polarity to form a base region of the second polarity; and thereafter ion-implanting a portion of the substrate and polysilicon with a dopant of the first polarity where an emitter region of the substrate is to be formed, wherein the emitter region when formed extends to the isolation oxide along an emitter-isolation oxide junction;

ion-implanting a portion of the substrate and polysilicon with a dopant of the second polarity where the emitter region extends to the isolation oxide along the emitter-isolation oxide junction and not over the entire emitter area; and annealing the substrate to diffuse the second ion-implanted dopant of the second polarity into the base region along the emitter-isolation oxide junction.

7. A method as recited in claim 6 wherein the step of ion-implanting a portion of the substrate and polysilicon with a dopant of the second polarity where the emitter extends to the isolation oxide is performed simultaneously with a step of doping the substrate and polysilicon with a dopant of the second polarity to form a base connection in the polysilicon.

8. A method as recited in claim 6 wherein the step of ion-implanting a portion of the substrate and polysilicon with a dopant of the second polarity where the emitter extends to the isolation oxide includes a step of masking the polysilicon over the emitter region to expose only that portion of the emitter region that is adjacent to the isolation oxide.

9. A method as recited in claim 8 wherein the step of masking the polysilicon over the emitter region exposes about 0.2 microns of the emitter region adjacent to the isolation oxide.

10. A method as recited in claim 6 wherein the transistor is an NPN transistor, wherein the polarity of the emitter and collector is negative and the polarity of the base is positive.

11. A method as recited in claim 10 wherein the step of ion-implanting a portion of the substrate and polysilicon with a dopant of the second polarity where the emitter extends to the isolation oxide is performed by ion implanting a dopant at an energy within the range of 20 to 100 KV.

12. A method as recited in claim 6 wherein the transistor is a PNP transistor, wherein the polarity of the emitter and collector is positive and the polarity of the base is negative.

* * * * *